United States Patent [19]

Douglas

[11] Patent Number: 5,316,895

[45] Date of Patent: May 31, 1994

[54] PHOTOLITHOGRAPHIC METHOD USING NON-PHOTOACTIVE RESINS

[75] Inventor: Monte A. Douglas, Coppell, Tex.

[73] Assignee: Texas Instruments Incorporated, Dallas, Tex.

[21] Appl. No.: 994,049

[22] Filed: Dec. 16, 1992

Related U.S. Application Data

[63] Continuation of Ser. No. 606,231, Oct. 31, 1990, abandoned.

[51] Int. Cl.$^5$ ............................................. G03C 5/16
[52] U.S. Cl. ................................ 430/313; 430/317; 430/323; 430/325; 430/326; 430/327
[58] Field of Search ............... 430/270, 313, 317, 322, 430/323, 325, 326, 331, 327

[56] References Cited

U.S. PATENT DOCUMENTS

| | | | |
|---|---|---|---|
| 3,847,609 | 11/1974 | Breslow et al. | 430/325 |
| 4,612,085 | 9/1986 | Jelks | 118/728 |
| 4,634,644 | 1/1987 | Irving et al. | 430/270 |
| 4,751,170 | 6/1988 | Mimura | 430/323 |
| 4,818,665 | 4/1989 | Haruta et al. | 430/270 |
| 4,826,564 | 5/1989 | Desilets | 430/314 |
| 4,921,778 | 5/1990 | Thackeray et al. | 430/326 |

OTHER PUBLICATIONS

Burggraaf, Pieter S., "Multilayer-Resist Lithography", *Semiconductor International,* Jun. 1983, pp. 48–55.
Roland, et al., "The Mechanism of the Desire Process", publication and date unknown.

*Primary Examiner*—Marion E. McCamish
*Assistant Examiner*—Kathleen Duda
*Attorney, Agent, or Firm*—Ira S. Matsil; James C. Kesterson; Richard L. Donaldson

[57] ABSTRACT

A method for patterning an integrated circuit workpiece comprises depositing a layer of non-photoactive material on the wafer. A reagent is deposited onto the entire surface of the material. A pattern is then created by exposing the surface with an energy source which produces a reaction within the reagent and/or between the reagent and the resin. The unreacted reagent is then removed by either physical or chemical means. Finally, the unexposed material is removed by means of an etch.

26 Claims, 2 Drawing Sheets

PHOTOLITHOGRAPHIC METHOD USING NON-PHOTOACTIVE RESINS

This application is a continuation of application Ser. No. 07/606,231, filed Oct. 31, 1990, now abandoned.

TECHNICAL FIELD OF THE INVENTION

This invention relates in general to microlithography, and in particular to surface imaging technology with the use of non-photoactive resists.

BACKGROUND OF THE INVENTION

There is currently a need to fabricate integrated circuits with extremely small (less than one micron) dimensions. In cases where the wafer topography is uneven or nonplanar, optical imaging problems limit the dimensions possible. Additional problems are caused by the nature of wet etch or development methods. For example, sloped sidewalls of the resist image cause lower image contrast and critical dimension (CD) control in image transfer to an underlying layer.

To meet this problem, trilayer microlithographic processes have been developed. One example is disclosed by P. S. Burggraaf ("Multilayer-Resist Lithography", Semiconductor International (June 1983)) who describes a method for patterning an integrated circuit by first forming a planarization layer of organic material with a depth sufficient to allow a substantially planar outer surface. A second, masking resist layer is spin-deposited on the first layer followed by the deposition of a third imaging layer. The imaging layer is selectively patterned and the pattern is transferred to the masking layer which is then developed. This is followed by an oxygen-based reactive ion etch (RIE) etch to transfer the pattern to the surface of the workpiece.

Several problems are present with the trilayer approach. It is often difficult to remove the second masking layer due to its hardened nature. Also, the creation of undesired particulate matter lowers throughput yields. In addition, although the imaging layer will reduce the depth of field by as much as a factor of two, the technique does not utilize the limits of the optical imaging tool.

Another approach, described by B. Roland et al. is the DESIRE ™ process. Here a thick, planarizing layer of resist is deposited on the wafer. Silicon is then selectively incorporated from the gas phase into the photo-exposed areas after coating and photo-exposure of the resist. In an oxygen plasma, the incorporated silicon will form an oxide mask that stops etching in the photo-exposed areas.

One problem occurs because a production-worthy deep ultraviolet (UV) resist has yet to be developed. A significant problem with current experimental resists is related to the exposure sensitivity. The light doses, in units of millijoules per centimeter, required to create an image are currently unacceptably high. Low sensitivity results in low throughput and poor image contrast. Moreover, irrespective of the light dosage, resultantly developed image profiles are not acceptable. Also, with this method, the process latitude is not sufficient to meet fabrication process latitude requirements.

SUMMARY OF THE INVENTION

The present invention provides a process in which an anisotropic surface imaging technique which utilizes non-photoactive resists is used to achieve the smaller critical dimensions and critical dimension control now required in fabricated integrated circuits.

One aspect of the present invention comprises a process for depositing a layer of non-photoactive material, such as an organic dry etch resist, on the wafer. Next a reagent is deposited onto the entire surface on the material. The reagent, such as an organometallic chemical, may be diffused into the material. A pattern is then created by exposing the surface with an energy source which produces a reaction within the reagent and/or between the reagent and the resin. This reaction could be produced by exposure to a UV light source utilizing surface imaging techniques. The unreacted reagent is then removed by either physical or chemical means such as a metal or oxide etch. Finally, the unexposed resist material is removed by means of an etch.

Compared to prior art methods, this method delivers much more flexibility as to the nature of the mask materials which may be used since the thick resist layer does not have to be photoactive. One advantage of this method is that a myriad of reagent compounds exist with reasonable vapor pressures such that many alternatives can be considered to address special circumstances associated with special lithographic requirements and to improve the resist's performance. One can easily explore a large body of various non-photoactive resist materials. Moreover, this method provides a surface imaging method that can be used over severe surface topography to produce very small features.

BRIEF DESCRIPTION OF THE DRAWINGS

The above features of the present invention will be more clearly understood from consideration of the following description in connection with accompanying drawings in which.

DETAILED DESCRIPTION

Figure 1:
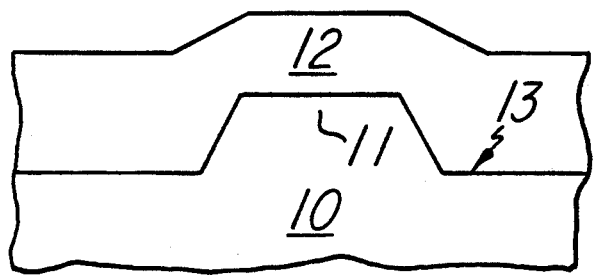
FIGS. 1-5 are greatly enlarged schematic sectional views of an integrated circuit workpiece illustrating various steps in the multilayer photolithographic process of the invention.

Referring first to FIG. 1, an integrated circuit workpiece is shown in a greatly enlarged schematic cross-section, and is generally indicated at 10. Workpiece 10 has a non-uniform topography that is represented schematically by the raised structure 11. The workpiece 10 can constitute a substrate or a layer residing on a substrate.

In the process according to the invention, a layer 12 of non-photoactive material is deposited, for example by standard, spin-on technology, over an outer surface 13 of workpiece 10, including structure 11. Layer 12 can be formed of an organic dry etch resist which contains no photo-active compound (PAC) agents: Layer 12 may be more planar than the outer surface 13.

Figure 2:
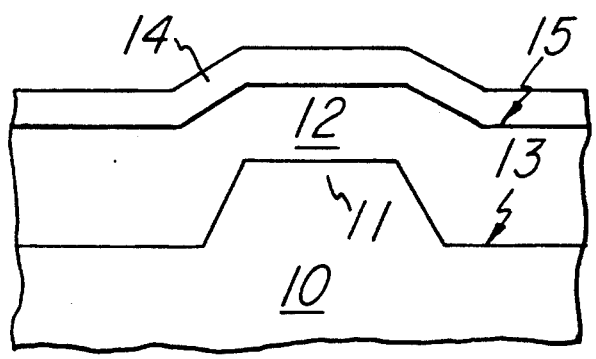

Referring next to FIG. 2, a layer 14 of a reagent is deposited over an outer surface 15 of layer 12. Layer 14 can typically be an organometallic compound. In a preferred embodiment, surface 15 is exposed to a vapor that diffuses into layer 12. As will be recognized by those skilled in the art, the depth can be determined, in part, by time and temperature. The vapor may be an organometallic compound such as for example molybdenum hexacarbonyl, tetramethyl silane, trimethyl aluminum or tungsten hexacarbonyl. The reagent and resist material may react chemically upon contact or in the presence of light and/or heat.

Figure 3:
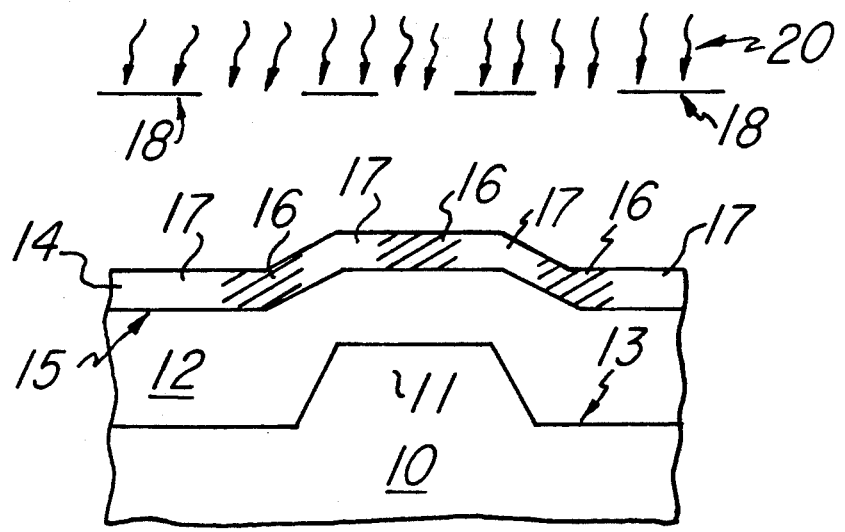

Referring now to FIG. 3, the layer 14 is exposed to an energy source 20 through a mask pattern 18. Examples of methods of exposure are projection printing, contact printing, e-beam writing or laser beam writing. In a preferred embodiment, the layer 14 is exposed to a patterned aerial image emanating from a deep UV light source 20. In other embodiments, the energy source 20 could utilize electrons, x-rays or ions. The energy 20 will produce a reaction within the reagent and/or between the resin and reagent in layer 14. The reaction generates a product that serves as an etch mask during subsequent etching steps. The reacted material is noted as 16 and the unreacted material is noted as 17. In the embodiment shown, the pattern 16 is a positive tone, latent image. It will be appreciated of course that in an alternate embodiment the pattern 16 could be a negative tone, latent image.

As an example, in a preferred embodiment, the deep UV photons 20 dissociate the organometallic molecule, resulting in a subsequent reaction between the metal and chemical groups in the etch resist material 14. For example, the metal can be oxidized by the hydroxyl groups of a cresol resin such as for example Novalak. In another example, the photo reaction may be limited to the reagent itself, producing for example a metal in a different oxidation state.

Because the resist layer 14 is very thin and the layer 12 may planarize the surface 13 to some extent, the technique described in the preferred embodiment for creating a resist sensitive to the deep LTV light allows use of surface imaging, imaging only on or near the surface. This reduces concern for depth of focus which is a problem with prior art methods. This also improves the lithographic system by alleviating several optical imaging problems and by driving the system to its theoretical limits. Moreover, organometallic compounds have very high extinction coefficients for deep UV absorption. Therefore, very high exposure sensitivity is expected from this type of a deep UV resist. When using a dry developable resist, high exposure sensitivity also implies excellent contrast and well-formed, vertical resist images with crisp pattern edge definition for excellent CD control.

Figure 4:
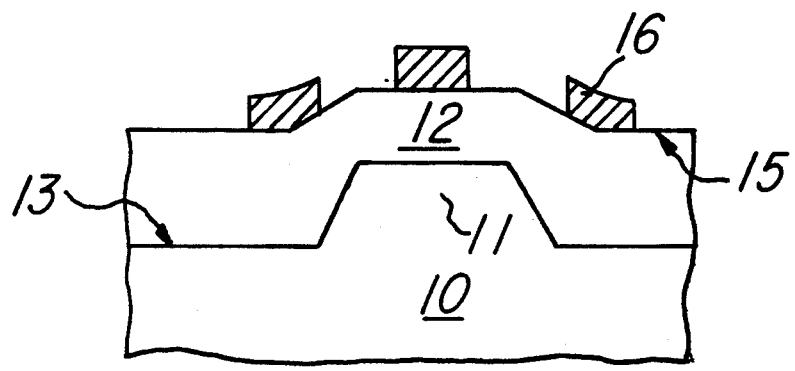

Next the unreacted layer 17 is removed by physical, such as thermal, or chemical means. In the preferred embodiment, the unreacted metallic layer 17 is selectively removed by means of a metal etch leaving the pattern 16. This is an example of a positive tone, latent image. The resulting cross-section is shown in FIG. 4. An alternate embodiment, that of a negative tone, latent image, not shown, an oxide etch would remove layer 16, leaving the pattern 17. As another example, the unreacted reagent is driven out of layer 12 by thermal disorption at elevated temperatures under vacuum.

The steps of patterning the surface, removing the unreacted or reacted reagent, and removing the exposed material may be combined.

Figure 5:
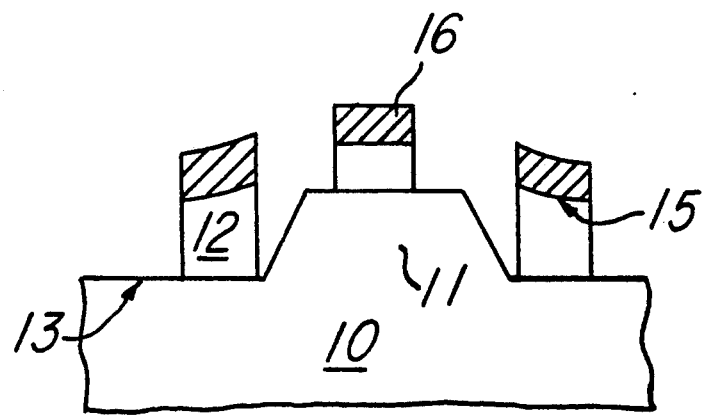

Referring now to FIG. 5, the unexposed layer 12 is removed by means of an etch leaving the surface 13 exposed as desired. In a preferred embodiment, the workpiece is subjected to a dry develop process. During this process, an oxide etchant may react with the masking layer 16 to create a metal-oxide barrier.

In an alternate embodiment, not shown, the material incorporated into the resin may react with chemical groups on the resist resin upon first exposure to the vapor. As such, the photoexposure phase would dissociate the reacted material, causing it to evolve from the resist.

EXAMPLE

In one example, the resist deposited on the wafer is a Novalak resin comprised of a cresol polymer. Molybdenum hexacarbonyl [$Mo(CO)_6$] is incorporated into the resin to a given depth of about 1000 to 3000 angstroms by liquid or vapor exposure. The wafer is then photoexposed on a deep UV imaging optical tool. The light dissociates some of the carbonyl groups, liberating $Mo(CO)_x$ to react with a hydroxyl group on the cresol to from a very stable Mo-O bond and/or form Mo in a lower oxidation state such as $Mo(CO)_{6-x}$ where $x \leq 6$. The wafer is then thermally treated to drive off the unexposed $Mo(CO)_6$. Afterwards, the resist resin is developed in a plasma etch using oxygen which removes the resin while forming a more stable molybdenum oxide to serve as a resist imaging mask. The oxygen plasma may convert more of the Mo in lower oxidation states to its metal oxide. This occurs because the [Mo] concentration is much greater than the hydroxyl group, [—OH], concentration.

What is claimed is:

1. A process for applying a pattern to a workpiece used in fabricating an integrated circuit, comprising the steps of:
   depositing a layer of non-photosensitive material on said workpiece said layer having a surface;
   diffusing a reagent to a selected depth into the surface of said non-photosensitive material to form a reagent region;
   subsequent to said diffusing step, patterning the surface with an energy source such that said reagent reacts with said non-photosensitive material to define a portion of said reagent region to be removed;
   removing said portion of said reagent region to leave an exposed portion and an unexposed portion of said non-photosensitive material; and
   removing said exposed portion of said non-photosensitive material by means of an etch while substantially maintaining said unexposed portion of said non-photosensitive material.

2. The process of claim 1, wherein said step of depositing a layer comprises the step of depositing a layer of non-photosensitive material on the wafer such that said layer is more planar than the workpiece surface.

3. The process of claim 1, wherein said step of depositing a layer comprises the step of depositing a layer of an organic resin.

4. The process of claim 3, wherein said organic resin comprises an organic dry etch resist.

5. The process of claim 1, wherein said step of diffusing a reagent comprises the step of diffusing a reagent on the entire surface of said layer of non-photosensitive material by means of vapor diffusion.

6. The process of claim 1 and further comprising the step of, subsequent to diffusing a reagent but prior to patterning the surface, reacting the reagent with the material.

7. The process of claim 1, wherein said step of patterning comprises the step of exposing the surface with an energy source which produces a reaction within the reagent.

8. The process of claim 1, wherein said step of patterning comprises the step of exposing the surface with an energy source which produces a reaction between the reagent and non-photosensitive material.

9. The process of claim 1, wherein said step of patterning comprises the step of patterning by means of surface imaging.

10. The process of claim 1, wherein said step of patterning comprises the step of patterning the surface with an ultraviolet light.

11. The process of claim 1, wherein said step of removing said portion of said reagent region comprises the step of removing an unreacted portion of said reagent region by means of an oxide etch.

12. The process of claim 1, wherein said step of removing said portion of said reagent region comprises the step of removing an unreacted portion of said reagent region by means of a metal etch.

13. The process of claim 1, wherein said step of removing said exposed portion of non-photosensitive material comprises the step of removing the exposed portion by means of a dry etch.

14. The process of claim 1, wherein one or more of said steps of patterning the surface, removing said portion of said reagent region, and removing the exposed portion are combined to be performed in a single step.

15. The process of claim 1 wherein said reagent comprises an organometallic compound.

16. The process of claim 15 wherein said reagent is selected from the group consisting of molybdenum hexacarbonyl, tetramethyl silane, trimethyl aluminum and tungsten hexacarbonyl.

17. The process of claim 1 wherein the energy source is selected from the group consisting of ultraviolet light, laser light, electrons, x-rays, and ions.

18. The process of claim 17 wherein said energy source comprises an ultraviolet light source.

19. The process of claim 1 wherein said selected depth is between about 1000 and 3000 Angstroms.

20. The process of claim 1 wherein said step of removing said portion of said reagent region comprises removing a reacted portion of said reagent region by physical means.

21. The process of claim 1 wherein said step of removing said portion of said reagent region comprises removing a reacted portion of said reagent region by chemical means.

22. The process of claim 1 wherein said portion of said reagent to be removed comprises a portion of said reagent which reacted with said non-photosensitive material.

23. The process of claim 1 wherein said portion of said reagent to be removed comprises a portion of said reagent which did not react with said non-photosensitive material.

24. The process for applying a pattern to a workpiece used in fabricating an integrated circuit, comprising the steps of:
depositing a resist layer on said workpiece, said resist comprising a cresol polymer;
blanket diffusing molybdenum hexacarbonyl to a depth of between about 1000 and 3000 angstroms into a surface of said resist layer;
subsequent to said blanket diffusing step, patterning the surface with an ultraviolet imaging tool such that said molybdenum hexacarbonyl reacts with said resist layer to produce a reacted region and an unreacted region within said resist layer;
removing the unreacted region of said resist layer to leave an exposed portion and an unexposed portion of said non-photosensitive material; and
removing said exposed portion of said non-photosensitive material while substantially maintaining said unexposed portion of said non-photosensitive material.

25. A process for applying a pattern to a workpiece used in fabricating an integrated circuit, comprising the steps of:
depositing a single layer of non-photosensitive material on said workpiece, said layer having a surface;
performing an unpatterned diffusion of a photoactive reagent into said single layer, said diffusion not assisted by irradiation;
performing a patterned irradiation subsequent to said diffusion step, said irradiation activating a reaction between said diffused photoactive reagent and said non-photoactive material to generate an etch mask portion and a pattern portion; and
removing said pattern portion to expose an area to be processed on said integrated circuit.

26. The process of claim 25, wherein said photoactive reagent is an organometallic compound.

* * * * *